(12) United States Patent
Jung

(10) Patent No.: US 12,092,697 B2
(45) Date of Patent: Sep. 17, 2024

(54) SYSTEM AND METHODS FOR RECHARGEABLE BATTERY ANALYSIS, MONITORING, AND DIAGNOSTICS

(71) Applicant: Purdue Research Foundation, West Lafayette, IN (US)

(72) Inventor: Byunghoo Jung, West Lafayette, IN (US)

(73) Assignee: Purdue Research Foundation, West Lafayette, IN (US)

(*) Notice: Subject to any disclaimer, the term of this patent is extended or adjusted under 35 U.S.C. 154(b) by 141 days.

(21) Appl. No.: 17/867,360

(22) Filed: Jul. 18, 2022

(65) Prior Publication Data

US 2023/0021402 A1 Jan. 26, 2023

Related U.S. Application Data

(60) Provisional application No. 63/222,991, filed on Jul. 17, 2021.

(51) Int. Cl.
| | |
|---|---|
| *G01R 31/392* | (2019.01) |
| *G01R 31/367* | (2019.01) |
| *G01R 31/382* | (2019.01) |
| *H01M 10/48* | (2006.01) |

(52) U.S. Cl.
CPC ........ *G01R 31/392* (2019.01); *G01R 31/367* (2019.01); *G01R 31/382* (2019.01); *H01M 10/48* (2013.01)

(58) Field of Classification Search
None
See application file for complete search history.

(56) References Cited

U.S. PATENT DOCUMENTS

2009/0096459 A1* 4/2009 Yoneda ............... G01R 31/367
324/430

* cited by examiner

*Primary Examiner* — Jas A Sanghera
(74) *Attorney, Agent, or Firm* — Piroozi-IP, LLC

(57) ABSTRACT

A method of determining state of health (SoH) of a battery is disclosed which includes receiving a predetermined open circuit voltage ($V_{OC}$) vs. a state of charge (SoC) characteristics for a pristine battery, establishing a single battery model including physical diffusion characteristics and electrical characteristics based on lumped parameters thereby modeling diffusion resistance and capacitance of particles in the electrodes of the battery as well as electrical characteristics based on electrical resistance and capacitance from one electrode assembly to another, thereby generating equations describing voltage at the associated double-layers, solving the double-layer equations, thereby generating solutions for the double-layer electrical characteristics, and establishing a relationship between the solved double-layer characteristics and the SoC, thereby determining a SoH of the battery based on said relationship.

20 Claims, 17 Drawing Sheets

SYSTEM AND METHODS FOR RECHARGEABLE BATTERY ANALYSIS, MONITORING, AND DIAGNOSTICS

CROSS-REFERENCE TO RELATED APPLICATIONS

The present non-provisional patent application is related to and claims the priority benefit of U.S. Provisional Patent Application Ser. No. 63/222,991, entitled SYSTEM AND METHODS FOR RECHARGEABLE BATTERY ANALYSIS, MONITORING, AND DIAGNOSTICS which was filed Jul. 17, 2021, the contents of which are hereby incorporated by reference in its entirety into the present disclosure.

STATEMENT REGARDING GOVERNMENT FUNDING

None.

TECHNICAL FIELD

This disclosure relates to rechargeable batteries and, in particular, to analysis, diagnostics, and monitoring of rechargeable batteries.

BACKGROUND

This section introduces aspects that may help facilitate a better understanding of the disclosure. Accordingly, these statements are to be read in this light and are not to be understood as admissions about what is or is not prior art.

Battery electrochemical state may include, for example, the state of charge and state of health of a battery. Accurately estimating the electrochemical state of rechargeable batteries is important for, among other reasons, prolonging lifetime, maintaining performance, and preventing malfunctions or system failures of many electrical systems that rely on batteries such as electric vehicles (EV) and energy storage systems (ESS). It is also important for accurately estimating the time to recycle batteries. The battery equivalent circuit model (ECM) plays an important role in battery electrochemical state estimation and monitoring. The model needs to be accurate for accurate electrochemical state estimation and compact for real-time online applications utilizing low-cost computing units.

Most modern mission-critical batteries have an in-built battery management system (BMS) that performs cell balancing, thermal management, and SoC/SoH estimation. Existing SoC and SoH estimation methods are either too time-intensive or not accurate enough. Several such methods and systems enable battery electrochemical state measurements utilizing accurate battery ECMs. These systems and method are typically divided into battery state of charge (SoC) and battery state of health (SoH).

Starting with SoC approaches, the first method is open circuit voltage (OCV) monitoring. Battery output voltage changes depending on its charging and discharging states. It shows the highest voltage when it is fully charged, and the lowest voltage when it is fully discharged. The SoC of a battery can be estimated by measuring its open-circuit voltage (OCV) and the premeasured SoC versus OCV curve.

OCV based SoC estimation has various issues. First, when the SoC is in the mid-range (ex: 20%-80%), the slope of the SoC vs. OCV curve is much smaller than that of high and low SoC ranges. Because of the small slope, a small voltage measurement error can result in a large SoC estimation error. Second, an SoC vs. OCV curve depends on temperature, and proper temperature compensation is required for an accurate SoC estimation based on OCV measurements. Third, an SoC vs. OCV curve changes over aging. Unlike temperature measurements, measuring or estimating the state of aging of a battery is not trivial, and the compensation of the aging effect is challenging. A paramount concern is that the $OCV_{transient}$ changes over time slowly towards a stable $OCV_{steady\text{-}state}$ because of relaxation. The relaxation can take more than 24 hours in the worst case. Because of the relaxation, a battery needs to rest in open circuit conditions typically for more than 3 hours to measure an accurate OCV. Although the OCV-based SoC estimation method has much higher accuracy than most other existing methods, because of the requirement for a long resting time, it is not suitable for real-time applications.

Another SoC approach is ampere hour counting (AHC). In this approach, a system can track the amount of charge delivered to or drawn from a battery by integrating its current over time. The system can estimate the state of charge (SoC) of a battery utilizing the estimated amount of charge. SoC is typically estimated using the equation shown below:

$$SoC(t) = SoC(0) - \frac{T}{C_N} \int_{t_0}^{t} (\eta I(t) - S_d) dt$$

where;

$SoC(0)$ = initial $SoC$ $CN$ = nominal capacity $h$ = coulombic efficiency $Sd$ = self-discharge rate.

AHC-based SoC estimation has three issues. First, the accuracy of current sensing is crucial because the current sensing error accumulates over time through integration. For example, when the current sensor used in the system has an offset and the load current toggles between positive (discharging) and negative (charging) values, the error caused by the offset will increase over time and degrade the SoC estimation accuracy. Because all current sensors have an offset and the offset drifts over time, compensating for the error caused by the current sensor offset is challenging. Second, the constants in the equation such as nominal capacity, coulombic efficiency, and self-discharge rate change over time resulting in increases in SoC estimation error. The biggest issue is that AHC based SoC estimation can provide only the changes in SoC ($\Delta$SoC), not the absolute SoC value. Because an absolute SoC value is required for battery management, the AHC-based method must be combined with other methods to provide an absolute SoC value. One example is combining the AHC method with the OCV method. The system can estimate the absolute SoC value using OCV based method after enough resting (off current condition)—for example after parking an electric vehicle overnight. Between the OCV based calibration points, the system can use AHC to estimate SoC, and the estimation error increases over time. If the increased error before the next calibration is within a tolerable range, the system can operate reliably. Consequently, the reliability of the system depends on the frequency of the calibration.

Another approach for estimating SoC is impedance-based SoC estimation. This approach makes use of the fact that the internal impedance of the battery changes during charging and discharging. Hence, a system can estimate the SoC of a battery by measuring its internal impedance. Typically, impedances, both real and imaginary parts, are measured at plural frequencies.

Impedance-based SoC estimation has four issues. First, impedance is a strong function of temperature and state of aging as well, and separating the effect of SoC from the effect of temperature and aging is challenging. Second, for accurate estimation, impedance should be measured at high and low frequencies, and measuring low-frequency impedance requires quite a long time which makes its real-time application challenging. Third, battery relaxation affects battery impedance, and compensating the effect of relaxation on impedance is not trivial. Fourth, its implementation is not simple. Because plural batteries are connected in series and parallel and the load and charging circuitry also contributes to the impedance, the impedance measurement circuitry has to be carefully designed to isolate the impedance of the target battery from the impedances of other batteries, load, and charging circuits. For these reasons, the method is mostly used in laboratories where the test conditions are tightly controlled and rarely used for online applications.

Another approach for estimating SoC is the ECM-based method. More than one method can be used together to overcome the limitations of the individual method. One widely used method is using OCV and AHC together along with a battery ECM. FIG. 1 is a schematic which shows a widely used battery ECM. The ECM-based method for determining SoC calculates the amount of charge delivered to or drawn from a battery utilizing the AHC method, estimates the changes in the open-circuit voltage (OCV) based on the amount of charge utilizing the OCV method, and finds the resulting terminal voltage (VT) utilizing the equivalent circuit model. The system compares the estimated terminal voltage and the measured terminal voltage to correct the estimated SoC value, and the correction process, typically implemented using Extended Kalman Filter (EKF), continues to keep the difference between the estimated and measured terminal voltages minimal.

The ECM-based SoC estimation method is becoming popular because of its real-time adaptation capability but has several technical issues. A paramount challenge is the accuracy of the equivalent circuit model and model parameters. The widely used circuit model shown in FIG. 1 is overly simplified and does not represent actual battery operation particularly for slow-changing voltage and current signals. More accurate equivalent circuit models have been developed, but those models are in general more complex than the model shown in FIG. 1. The increased complexity makes the terminal voltage estimation challenging. Also, the SoC estimation accuracy heavily depends on the accuracy of the circuit model parameters—resistances and capacitance. Because the model parameters are a function of SoC, temperature, and battery aging state, real-time parameter extraction is required. There are several real-time parameter extraction methods but none of them are perfect and their accuracy degrades with battery aging. These issues become worse when a more accurate equivalent circuit model with additional model parameters is used.

Because of the importance of accurate SoC estimation and the limitations of the existing solutions, many methods are under development. One of them is a machine learning-based method that requires a large set of data for training. Collecting a large set of reliable data requires batteries connected to a network, e.g., the Internet, synchronously or asynchronously, and the associated cost must be justified. Another one is an electrochemical model-based method utilizing a detailed battery electrochemical model incorporating mass transfer, thermal transfer, and thermodynamics equations. Because of its computational complexity, it has been used only for laboratory tests, not for in-field applications. Thus, an accurate SoC estimation methodology remains as an unmet need.

The second battery performance estimation toolset is directed to SoH of batteries. Although several SoH estimation methods have been developed, all existing methods have limitations and an accurate and reliable method has been eluding.

One common and most widely method is estimating SoH by estimating the battery series resistance (Rs in FIG. 1). Because the battery series resistance changes with battery aging, the battery aging stature (state of health: SoH) can be estimated by estimating the series resistance and using the correlation between the resistance and battery aging. Unfortunately, the correlation between the resistance and battery aging is not linear and shows a weak correlation during the early stage of battery aging; thus, making the early-stage SoH degradation estimation and failure prediction challenging.

Therefore, there is an unmet need for a novel approach to accurately profile state of charge and state of health of batteries which can overcome the aforementioned deficiencies.

SUMMARY

A method of determining state of health (SoH) of a battery is disclosed. The method includes receiving a predetermined open circuit voltage ($V_{OC}$) vs. a state of charge (SoC) characteristics for a pristine battery. The battery includes an anode electrode assembly which includes an anode collector, an anode electrode constituting a plurality of anode electrode slices, an anode double-layer, an electrolyte. The battery further includes a cathode electrode assembly, which includes a cathode collector, a cathode constituting a plurality of cathode electrode slices. During a charging cycle ionic electrolytic particles within the electrolyte migrate from the cathode assembly to the anode double layer and via a diffusion process diffuse into the plurality of anode slices. During a discharge cycle the ionic electrolytic particles within the electrolyte migrate from the anode assembly to the cathode double layer and via a diffusion process diffuse into the plurality of cathode slices. The method further includes establishing a single battery model including physical diffusion characteristics and electrical characteristics based on lumped parameters thereby modeling diffusion resistance and capacitance from associated double layers to associated slices as well as electrical characteristics based on electrical resistance and capacitance from the anode collector to the cathode collector, thereby generating equations describing voltage at the anode and cathode double-layers, solving the double-layer equations, thereby generating solutions for anode and cathode double-layer electrical characteristics, and establishing a relationship between the solved double-layer characteristics and the SoC, thereby determining a SoH of the battery based on said relationship.

A system for determining state of health (SoH) of a battery is also disclosed. The system includes a battery. The battery includes an anode electrode assembly which includes an anode collector, an anode electrode constituting a plurality of anode electrode slices, and an anode double-layer. The battery further includes an electrolyte and a cathode electrode assembly which includes a cathode collector, a cathode constituting a plurality of cathode electrode slices. During a charging cycle ionic electrolytic particles within the electrolyte migrate from the cathode assembly to the anode double layer and via a diffusion process diffuse into the plurality of anode slices, and wherein during a discharge cycle the ionic electrolytic particles within the electrolyte migrate from the anode assembly to the cathode double layer and via a diffusion process diffuse into the plurality of cathode slices. The system also includes a processor communicating with a non-transient memory. The processor is configured to receive a predetermined open circuit voltage ($V_{OC}$) vs. a state of charge (SoC) characteristics for a pristine battery, utilize a single battery model including physical diffusion characteristics and electrical characteristics based on lumped parameters thereby modeling diffusion resistance and capacitance from associated double layers to associated slices as well as electrical characteristics based on electrical resistance and capacitance from the anode collector to the cathode collector, generate equations describing voltage at the anode and cathode double-layers, solve the double-layer equations, thereby generating solutions for anode and cathode double-layer electrical characteristics, and establish a relationship between the solved double-layer characteristics and the SoC, thereby determining a SoH of the battery based on said relationship.

BRIEF DESCRIPTION OF DRAWINGS

—FIG. 9a: battery terminal voltage over time with different charging current, FIG. 9b: battery terminal voltage (4 A charging current) with and without diffusion mode.

DETAILED DESCRIPTION

Figure 1:
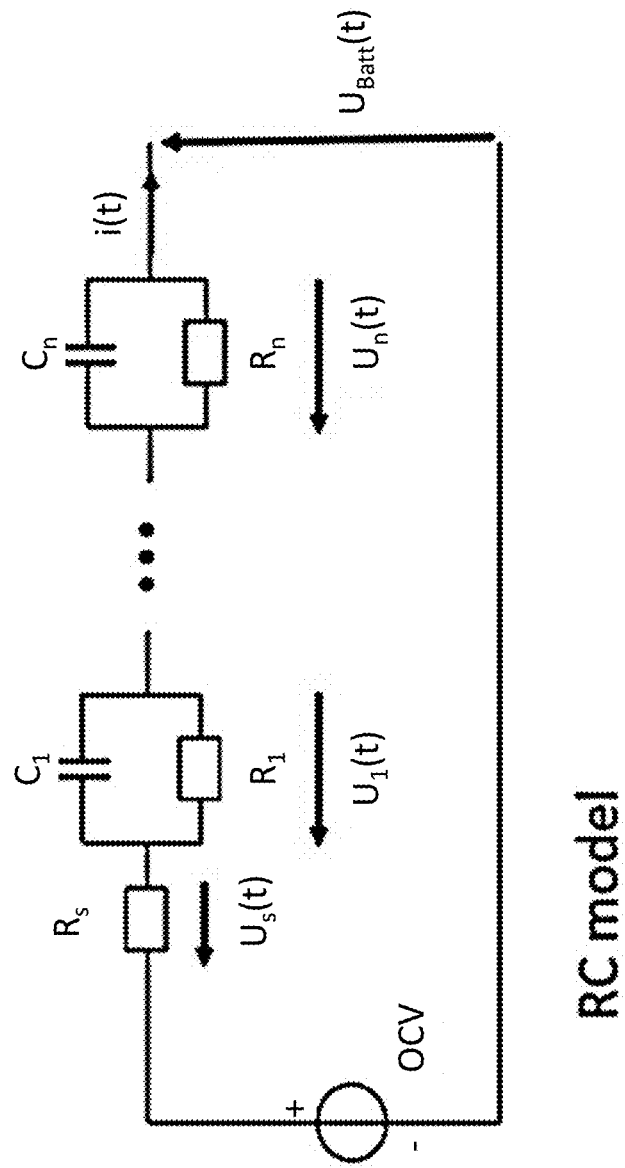
FIG. 1 is a schematic which illustrates an example of an existing battery equivalent circuit model (ECM).

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach is presented herein to accurately profile state of charge (SoC) and state of health (SoH) of batteries which can overcome the aforementioned deficiencies of prior art. Towards this end, the system and methods described herein provide, among other aspects, measuring the electrochemical state of rechargeable batteries including SoC and SoH resulting in accurate and compact battery equivalent models (ECMs) and battery status estimation utilizing the disclosed ECM.

Figure 2A:
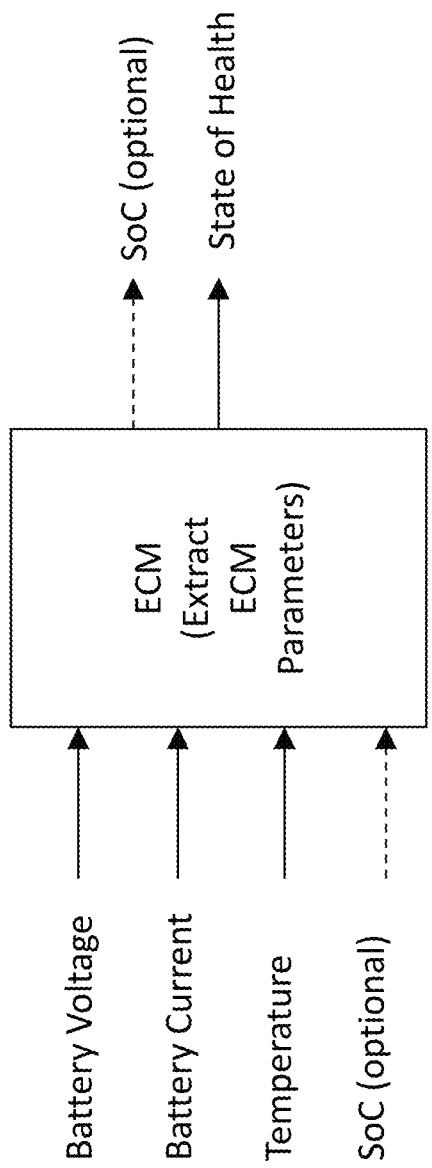
FIG. 2a is a high level block diagram depicting inputs and an output from the method and system of the present disclosure.

Referring to FIG. 2a, a high-level block diagram is shown depicting high-level inputs and outputs from the system and method of the present disclosure. Shown in FIG. 2a as input are battery voltage and battery current under load, temperature, and optionally an input associated with SoC. The under-load current and voltage of the battery during operation are used to extract ECM parameters as discussed below and further shown in FIG. 2c. The temperature is used as a scaling factor to augment variables in the ECM and hence the output SoH. The method and system of the present disclosure can either accept as input the SoC or calculate the SoC as an output. For the method and system of the present disclosure to calculate the SoC, a starting condition for particles, e.g., lithium (Li) concentration, needs to be known for an initial condition. For example, Li profile/amount in the anode of the battery at t=0 is known. With the initial condition known, the ECM can model and measured battery terminal current and voltage to track the Li profile/amount in anode over time. The total amount of Li in anode is substantially the SoC, which the method and system of the present disclosure can output.

Figure 2B:
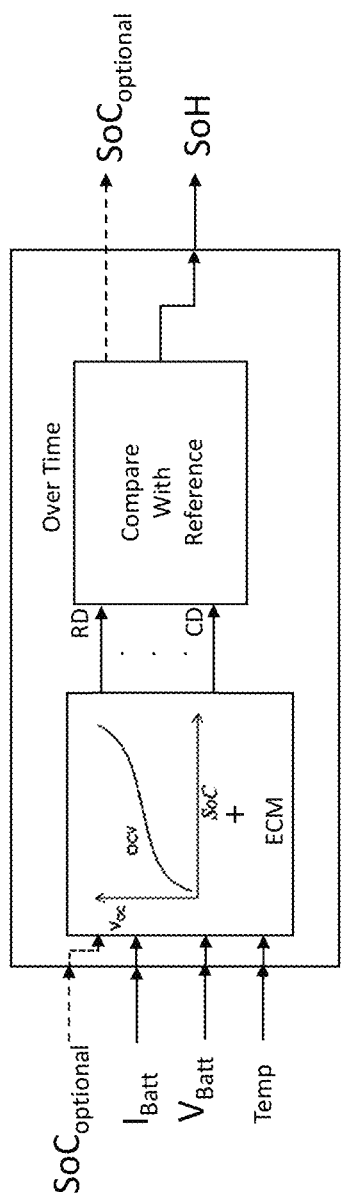
FIG. 2b is a simplified block diagram depicting inputs and output of the system and method of the present disclosure including an ECM further depicted in FIG. 2c.

Referring to FIG. 2b, a simplified block diagram is shown that depicts the typical inputs and outputs of the system and method of the present disclosure. As discussed further below, the SoC information is utilized to determine the open circuit voltage (VOC) from a predetermined curve that relates VOC to SoC when the battery has passed a relaxation state. The relaxation period is the period that is required for particles from one end of the electrode to diffuse to another thereby resulting in a substantially a constant diffusion state across each of the electrodes. Thus, by knowing the SoC, VOC of the battery is known. The VOC is then used to determine voltage associated with each electrode. Each battery has a known proportion of voltage associated with each electrode, the sum of which constitutes the VOC. Thus, by knowing VOC, one can determine the voltage associated with each of the electrodes based on a priori knowledge. The voltage associated with each electrode can then be used to extract information about internal structure of the electrode utilizing the novel ECM presented herein, as described below with respect to FIG. 2c. These parameters are monitored over time and compared to SoC to provide measure of SoH. It should be appreciated that SoC is provided as input based on methods known to a person having ordinary skill in the art, e.g., integration of current over time to determine charge remaining in the battery.

Figure 2C:
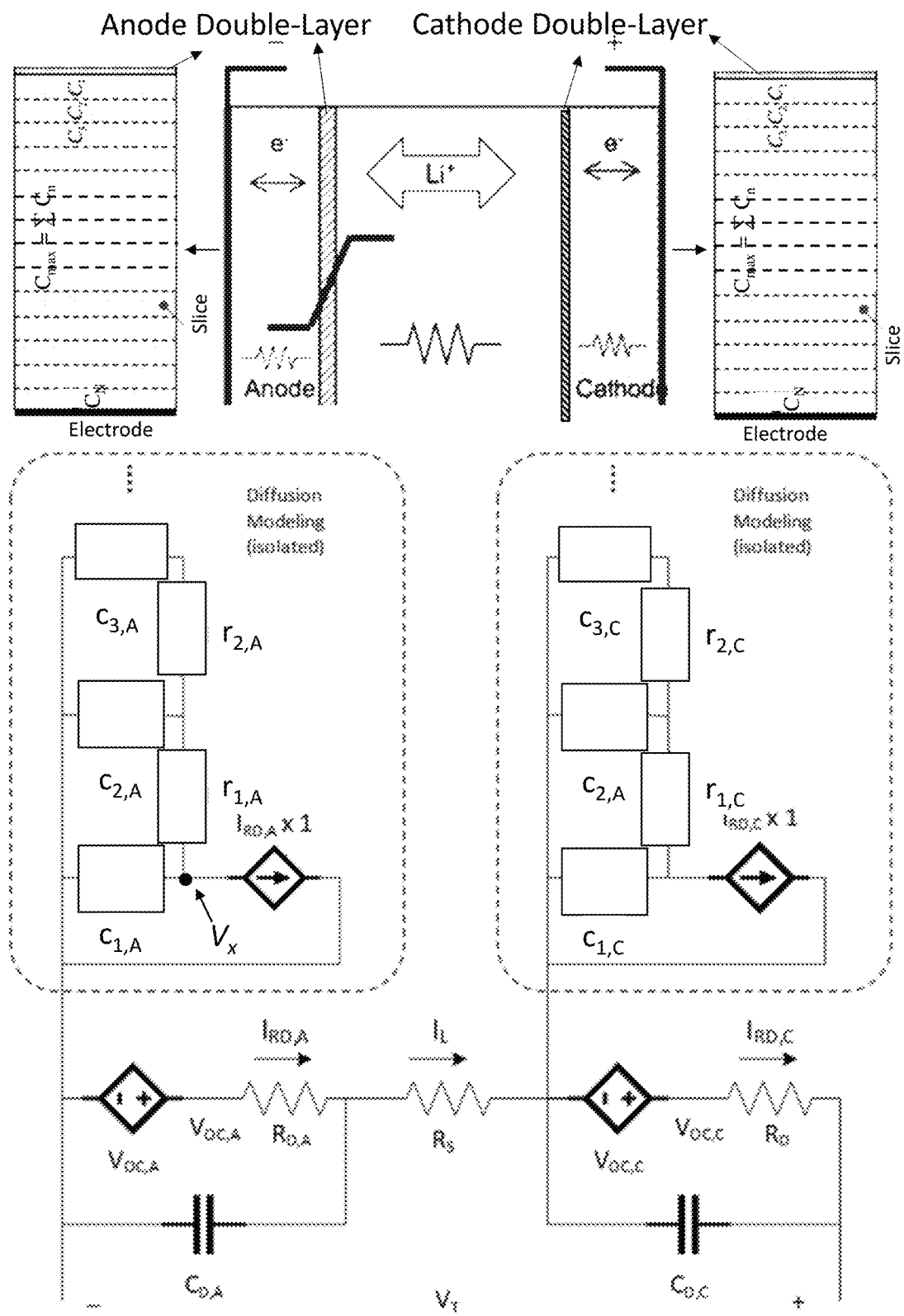
FIG. 2c is an ECM, according to the present disclosure which illustrates a combination of physical diffusion modeling and electrical modeling of a battery, also shown, illustrating current controlled current sources and voltage controlled voltage sources and dependencies on voltage ($V_x$).

Referring to FIG. 2c, a schematic is shown representing the ECM, according to the present disclosure. The ECM of FIG. 2c combines a physical diffusion model with an electrical model as a combination model shown in the ECM of FIG. 2c. This unitary model is capable of being run by a single tool. The diffusion of particles occurs when the particles (e.g., Li ion particles) migrate from the cathode through the electrolyte to the anode and enter the double layer of the anode. During the discharge process, the higher concentration of these particles are then diffused into the anode shown as a plurality of slices with the first slice ($C_1$) being next to the double layer and the last layer ($C_N$) being next to the collector. The same concept applies to the cathode during the charging process and its corresponding double layer and slices. The number of slices can be selected based on the tradeoff between accuracy and computation load. The model mirrors the double layer resistor current using a current-controlled current source (CCCS) with a fixed gain (gain=1 A/A is preferred) and uses the CCCS current to represent the amount of Li injected into (drawn from) each electrode—represented by an RC network. Ideally, the CCCS needs to mirror the double layer resistor current (IRD,A and IRD,C shown in FIG. 2c) but it can mirror the battery current ($I_L$ also shown in FIG. 2c) instead of the double-layer resistor current for simplicity.

The diffusion modeling is accomplished by resistance and capacitance elements representing resistance to diffusion for the particles from one slice to the next, and capacitance of the particles in said slices, respectively. These are denoted as $r_{1,A}, c_{1,A}, r_{2,A}, c_{2,A}, c_{3,A}, \ldots$, for the anode and $r_{1,C}, c_{1,C}, r_{2,C}, c_{2,C}, c_{3,C}, \ldots$, for the cathode. The electrical components are denoted as $R_{D,A}$ and $C_{D,A}$ for the anode's double layer, and $R_{D,C}$ and $C_{D,C}$ for the cathode's double layer.

As discussed above, the ECM further includes dependent sources such as CCCSs and VCVSs. Specifically, the CCCS in the anode is dependent on the current passing through the anode's double layer denoted as $I_{RD,A}$, which in part is generated by the VCVS denoted as $V_{OC,A}$, the open circuit voltage. Similarly, the CCCS in the cathode is dependent on the current passing through the cathode's double layer denoted as $I_{RD,C}$, which in part is generated by the VCVS denoted as $V_{OC,C}$, the open circuit voltage. It should be appreciated that as discussed above, the $V_{OC,A}$ and $V_{OC,C}$ are based on predetermined proportions for a specific battery and $V_{OC,A}+V_{OC,C}$ add up to $V_{OC}$ for the battery, a value provided as input to the system and method of the present disclosure via a non-linear curve shown in FIG. 2b and further discussed below. The ECM shows the anode model coupled to the cathode model via the electrolyte with a resistance denoted as $R_s$ ($R_s$ is the series combination of anode, cathode, and electrolyte resistance).

The models can be used to simulate the electrochemical behaviors of rechargeable batteries and are fully compatible with widely available SPICE circuit simulators. The ECM shown in FIG. 2c can be used to simulate/estimate the Li concentration profile in electrodes and hence battery state of charge (SoC). For example, during fast battery charging, the model can be used to estimate the Li concentration profile in anode in real-time and to provide a warning when the Li concentration at the anode-electrolyte interface area becomes close to the Li deposit risk level. The Li concentration is based on a analogous voltage ($V_x$) discussed further below. The ECM shown in FIG. 2c can also be used to estimate the changes in battery behaviors when battery design or operation parameters (ex: series resistance, double layer capacitance, charging current, etc.) are changed during battery developments.

As discussed above, the parameters in the dashed boxes in FIG. 2c represent diffusion of particles and the associated chemistry. The diffusion process is emulated as an electrical relationship utilizing pseudo electrical components. The diffusion process occurs according to the following relationship:

$$\begin{cases} \frac{\delta u(x,t)}{\delta} = D\frac{\partial u^2(x,t)}{dx^2} \\ u(x_n, t) \approx \frac{2M_0}{L}\sin\left(\frac{\pi x_n}{L}\right)e^{-\frac{t}{L^2/x^2 D}} = Ae^{-\frac{t}{B(D)}} \end{cases}$$

$$\begin{cases} i = \frac{v_1 - v_2}{R} = C\frac{dv_2}{dt} \\ v_2 = V_i e^{-1/RC} \end{cases}$$

where u is the concentration of Li particles in each slice,
$M_0$ is a material constant;
L is the width of each slice;
D is a diffusion coefficient; and
$x_n$ is accumulative distance from the double layer across the slices. The similarity between lithium concentration in one slice and an emulated voltage across that slice allows substitution of an electrical system for the chemical system describing the diffusion process.

Other aspects of the system and methods described herein include utilization of the ECM and measured battery terminal voltage and current to extract the ECM parameters and use the extracted ECM parameter values to estimate battery SoH. The model parameter extraction uses recursive algorithms such as recursive least squares. Depending on the choice of the equivalent circuit models, the measured voltage and current data can be high pass filtered before being used for the recursive algorithm. Because the ECM more accurately models battery behaviors such as relaxation and polarization, the resulting SoH estimation is more accurate than existing ECM-based methods. Also, because the ECM has only a few model parameters, parameter extraction utilizing recursive algorithms is simple enough to be performed using low-cost computing devices in real time. Because battery electrode-electrolyte interface capacitance and resistance show a strong correlation with battery aging (both in the early and late stages of aging), the extracted parameter values can provide an accurate battery SoH estimation.

Figure 3:
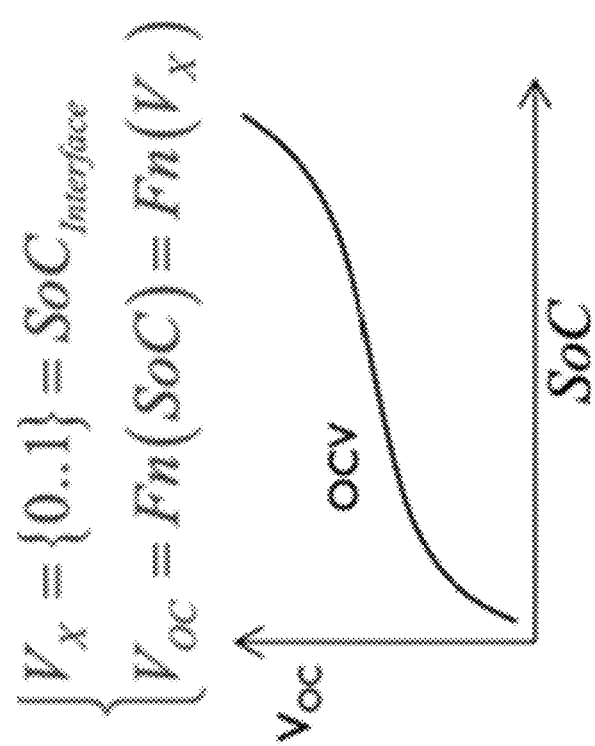
FIG. 3 is a graph of open circuit voltage ($V_{OC}$) vs. state of charge (SoC) that is supplied for a pristine battery expressing a non-linear relationship therebetween as well as a relationship with the $V_x$ of FIG. 2c.

In FIG. 2c, the junction associated with the first slide (next to the double-layer) is denoted as $V_x$. Referring to FIG. 3, the non-linear dependency between VOC and SoC is shown. The graph shown in FIG. 3 is a predetermined graph provided by a battery manufacturer. As shown in FIG. 3, this relationship is non-linear. Give the relationship shown in FIG. 3, VOC is a function of SoC, which also defines the relationship between VOC and $V_x$ (i.e., VOC is also a function of $V_x$ as defined by the relationship between VOC and SoC.

Figure 4:
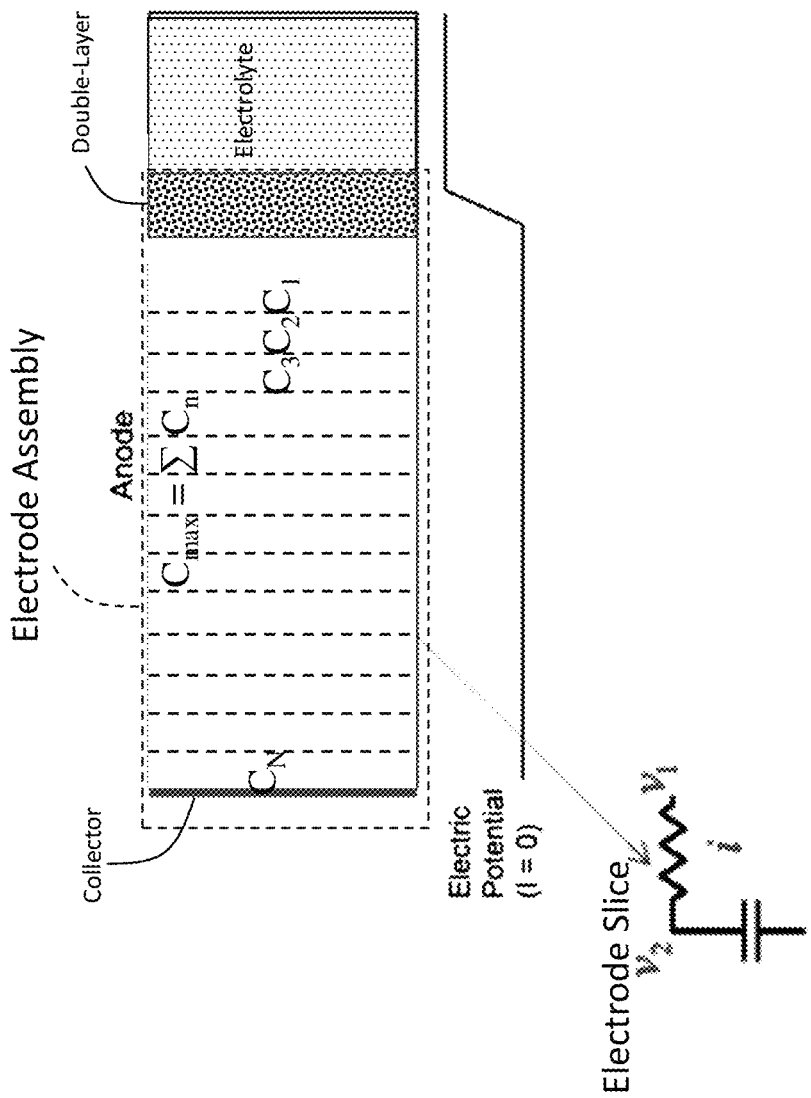
FIG. 4 is a schematic of the anode of FIG. 2c showing a plurality of slices therein with each slice modeled as a combination of lumped electrical elements, as well a double-layer (DL) and the electrolyte.

Referring to FIG. 4, each slice of the anode and cathode is shown to be modeled as a capacitor and resistor, as discussed above for diffusion modeling purposes. The overall diffusion capacitance is simply the sum of all the individual capacitances. One way of obtaining the capacitance of each layer is by dividing the total battery capacity by the number of layers. In this case, when the battery is fully charged (SoC=100%), the absolute voltage across each capacitor in anode at rest condition becomes 1V (normalized), and when the battery is fully discharged (SoC=0%), the voltage across each capacitor in anode at rest condition becomes 0V. The average capacitor voltage represents the rest-condition SoC, and the capacitor voltage of the layer close to the interface represents the interface SoC. Also, shown is the electrical potential at the interface between the double layer and the slices. As shown, while the electrolyte particles (e.g., Li) are ions at the double layer, therefore, defining a potential, as soon as these particles enter the slices, they become neutrally charged and therefore, the associated potential is zero.

Figure 5:
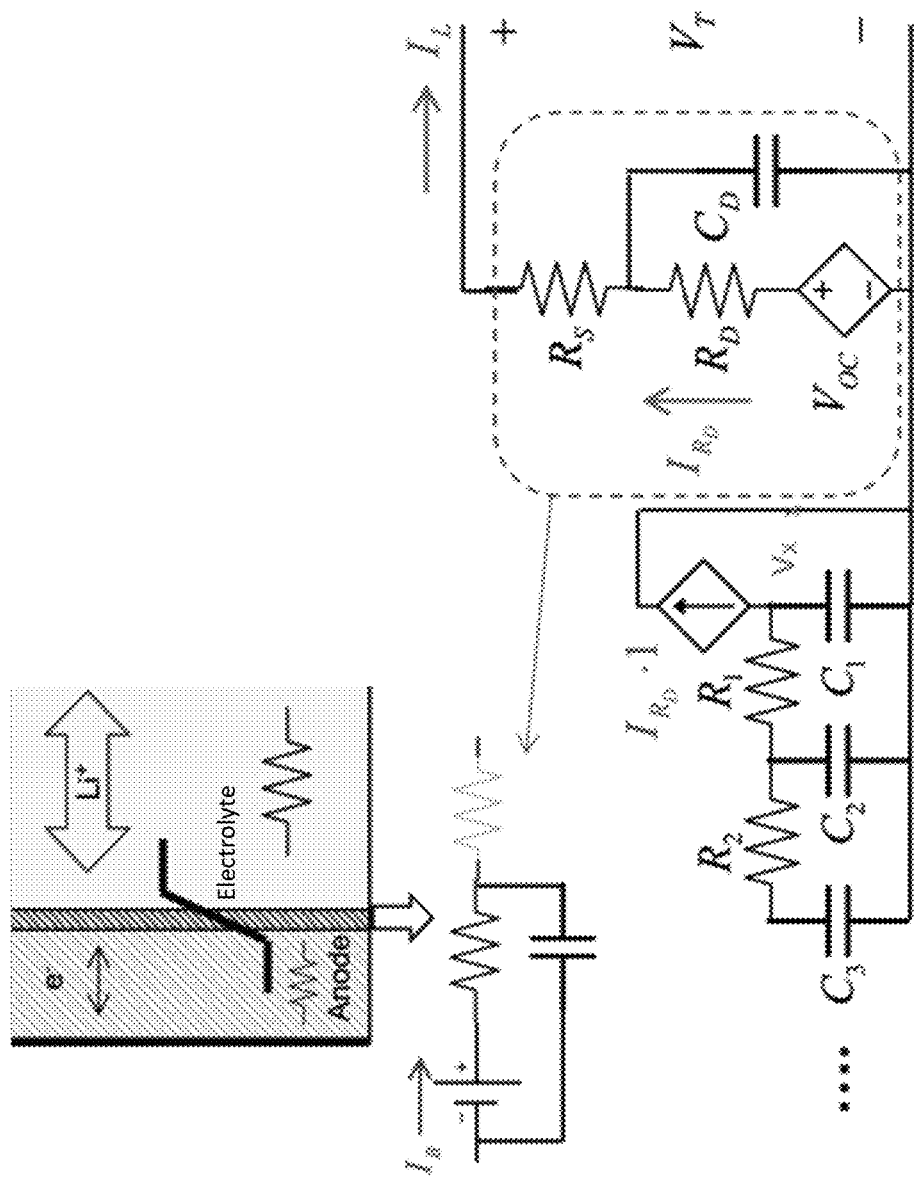
FIG. 5 is a schematic which illustrates an example of an electrical model of the battery double-layer—anode side.
Figure 6:
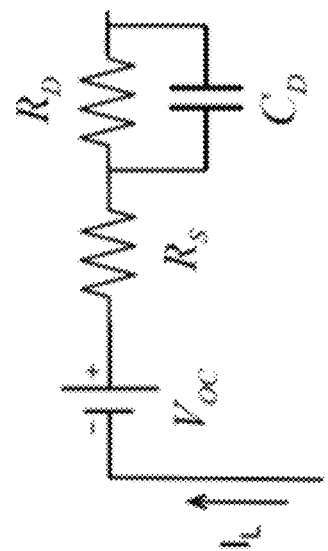
FIG. 6 is a schematic which illustrates an example of a simplified double layer electrical model.
Figure 6:
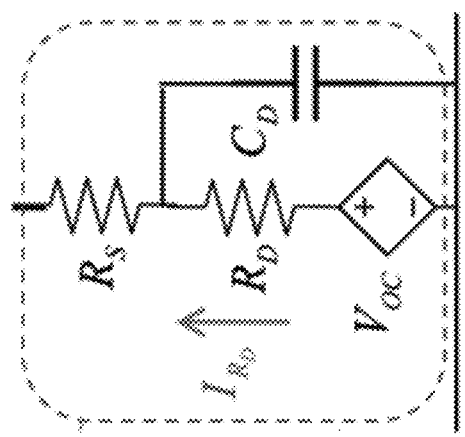

Referring to FIG. 5, a close up of the double layer model is shown. The model represents the electrode and electrolyte interface (the double layer) using a capacitor, a resistor, and a VCVS. In FIG. 5, RD represents double-layer resistance and CD represents double-layer capacitance, and VOC represents double-layer voltage that is controlled by the interface voltage ($V_X$ shown in FIG. 2c) that represents interface slice Li concentration. Ideally, VOC and RD are connected in series, and CD is connected in parallel with the series-connected VOC and RD. However, CD can be connected in parallel with RD as shown in FIG. 6 for simplicity at the cost of reduced accuracy.

Because the interface SoC determines the battery terminal voltage (output voltage), the model uses a VCVS to model the battery voltage from each electrode. Because the relation between the interface SoC and battery terminal voltage is not linear, the model uses the known relation between SoC and battery terminal voltage to determine the gain of the VCVS. When the ECM is used to simulate a small change in SoC and terminal voltage, the slope of the SoC versus terminal voltage curve at the operating point can be used as the gain of the VCVS. The resistance value of each RC represents the Li diffusion coefficient in each layer. Each layer can have different resistance values because the Li diffusion coefficient depends on Li concentration, but the same value can be used for all layers to make it simple assuming diffusion coefficient is a weak function of Li concentration. According to one embodiment of the present disclosure, the simulations can be run without including the effect of Li diffusion by simply setting the value of resistors in the RC network that represent each electrode to zero if required. When the value of the resistors in the RC network is set to zero, all capacitors can be combined into a single capacitor that represents battery capacity.

In some examples, the models can be used to simulate the electrochemical behaviors of rechargeable batteries and are fully compatible with widely available SPICE circuit simulators.

The ECMs can be utilized to estimate the changes in battery behaviors when battery design or operation parameters (ex: series resistance, double layer capacitance, charging current, etc.) are changed during battery analysis or developments.

Figure 7:
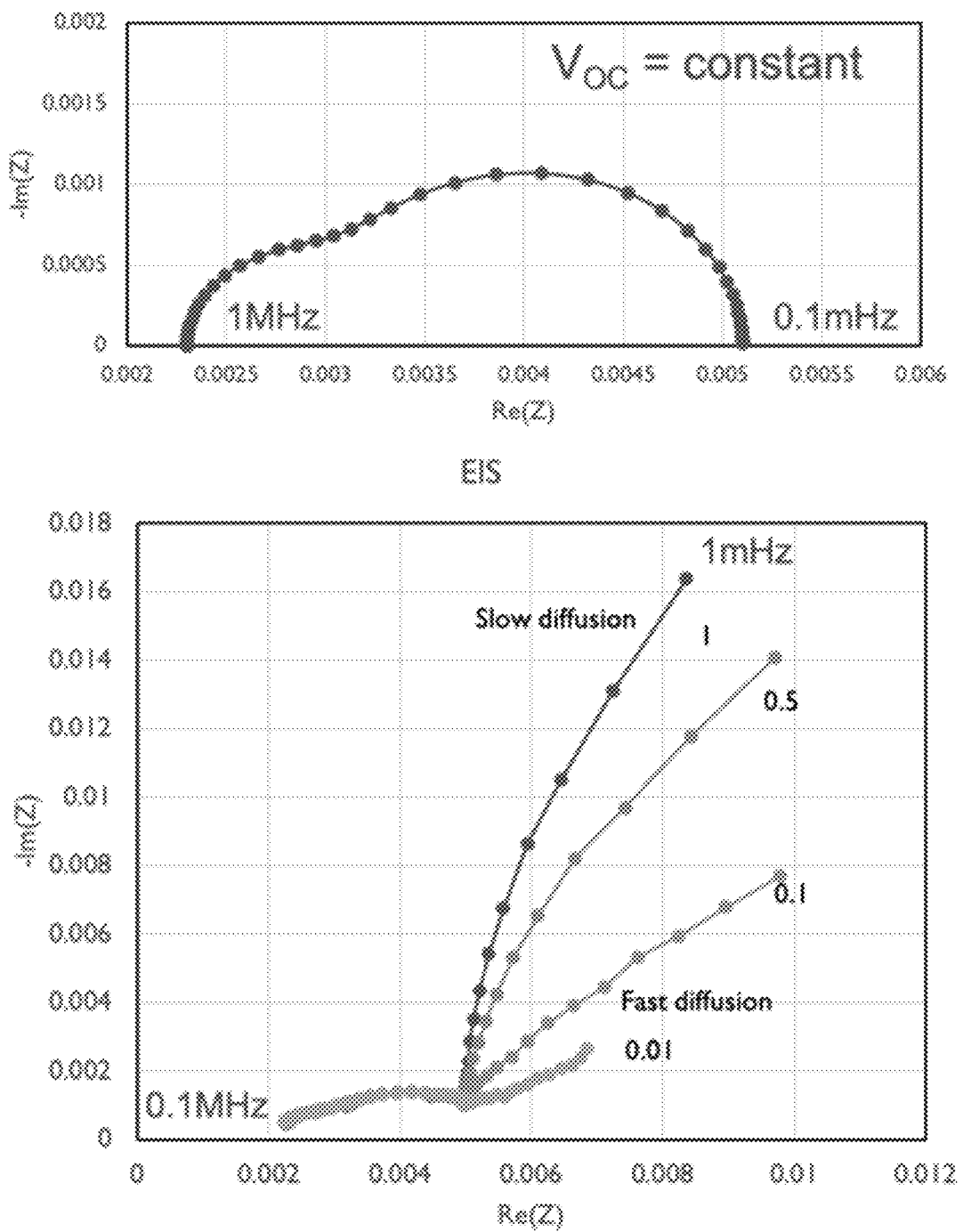
FIG. 7 is a set of graphs of imaginary and real parts of impedance associated with a simulated electrical impedance spectroscopy (EIS)—Without including diffusion (TOP) and including diffusion model with different diffusion coefficients (Bottom).

Referring to FIG. 7 graphs of real vs. imaginary part of an impedance representing battery EIS (electrical impedance spectroscopy) are provided based on simulation results with and without particles (e.g., Li) diffusion in electrodes. Without Li diffusion, EIS shows negligibly small reactive impedance at low frequencies, but with Li diffusion, EIS shows reactive impedance at low frequencies that match well with all experimentally reported battery EIS. A widely available SPICE circuit simulator (LT SPICE) is used for the simulation, and the results show that the model is fully compatible with SPICE simulators and the model can accurately predict battery EIS even at very low frequencies. It is important because existing battery models that can accurately predict low-frequency impedance are too complicated and not compatible with widely available SPICE simulators, and existing SPICE compatible models fail to accurately predict battery impedance at low frequencies. Accurately predicting low-frequency impedance is crucial for accurately predicting battery relaxation behavior, and accurately predicting battery relaxation behavior is important for accurate battery SoC and SoH estimations. The ECM also provides insights on the correlation between battery design parameters and battery electrical characteristics because of its white-box nature, and consequently, can accelerate battery design or analysis process.

Figure 8:
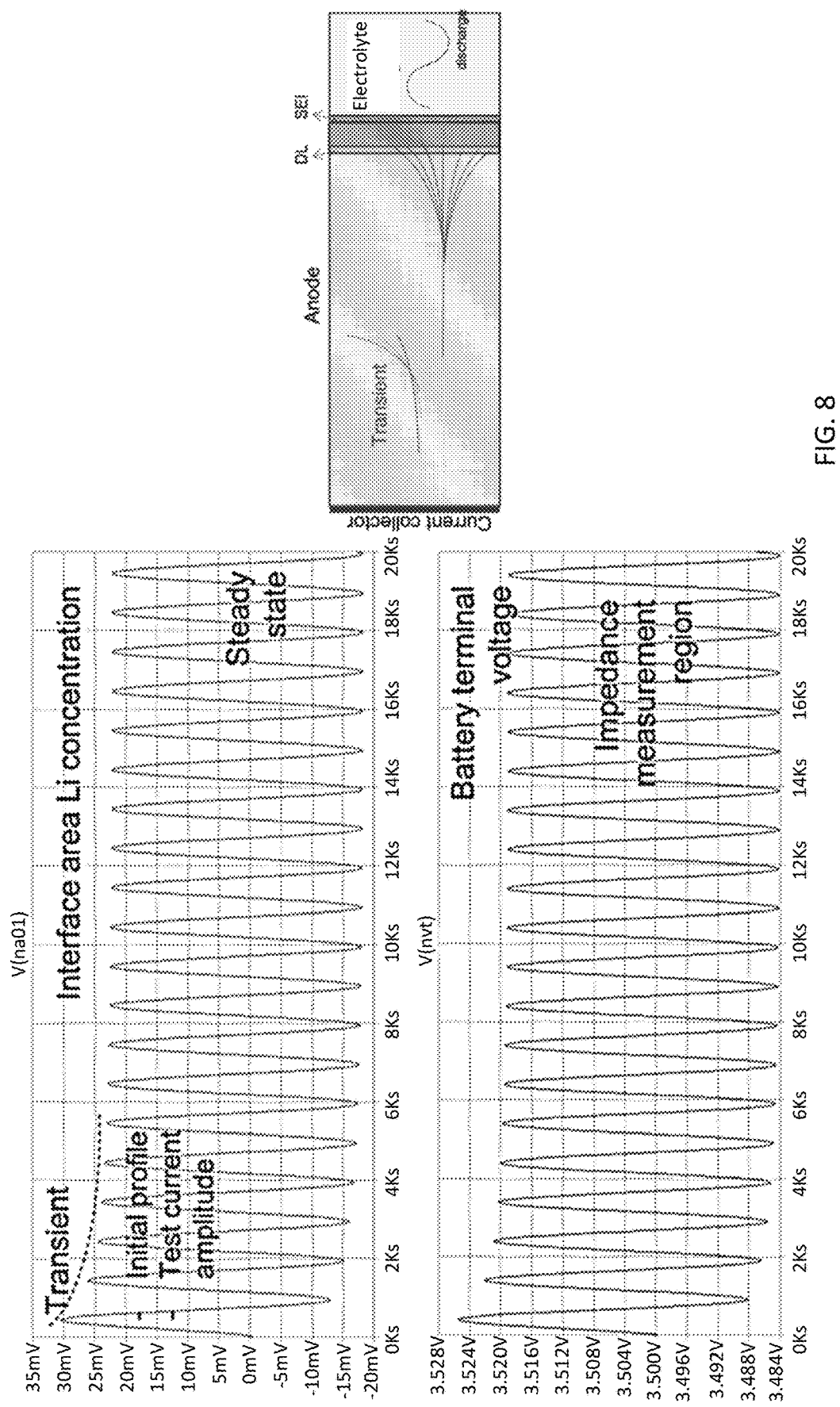
FIG. 8 is a set of graphs of voltage (mV) vs. time (S) which illustrates an example of simulation results for sinusoidal charging-discharging cycles, including a transient response before settling into a steady state.

Referring to FIG. 8, SPICE simulation results are provided showing battery terminal voltage and interface Li concentration in response to sinusoidal charging and discharging currents. These results show transient behavior before reaching a steady-state response. No existing battery models known—electrical, physical, and chemical—can predict such transient behavior, and thus, the ECM can accurately predict transient behavior.

Figure 9A:
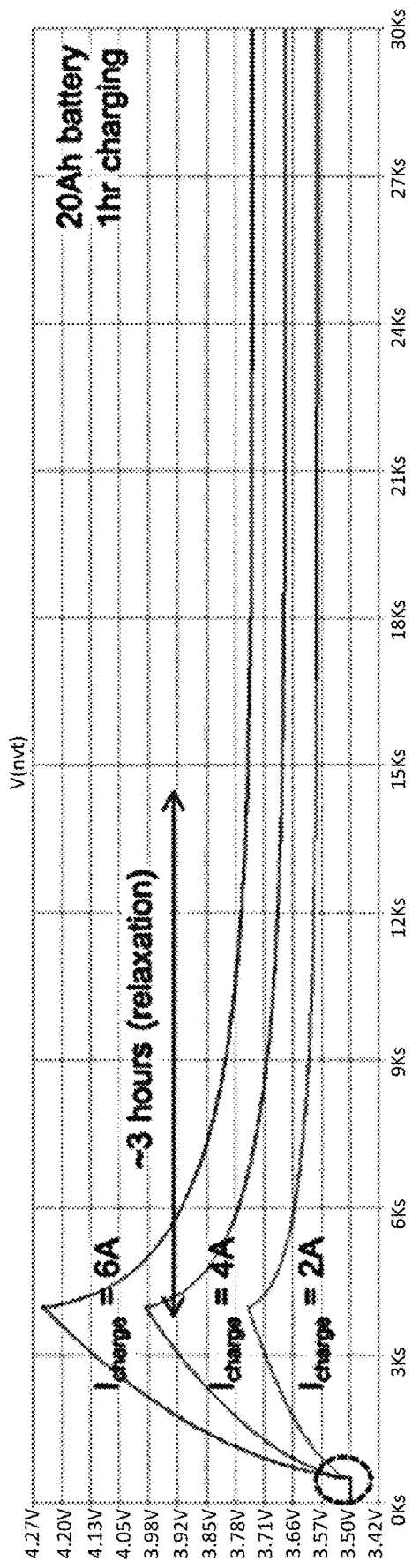
FIGS. 9a and 9b are set of graphs which illustrate a charging simulation utilizing the battery ECM
Figure 9B:
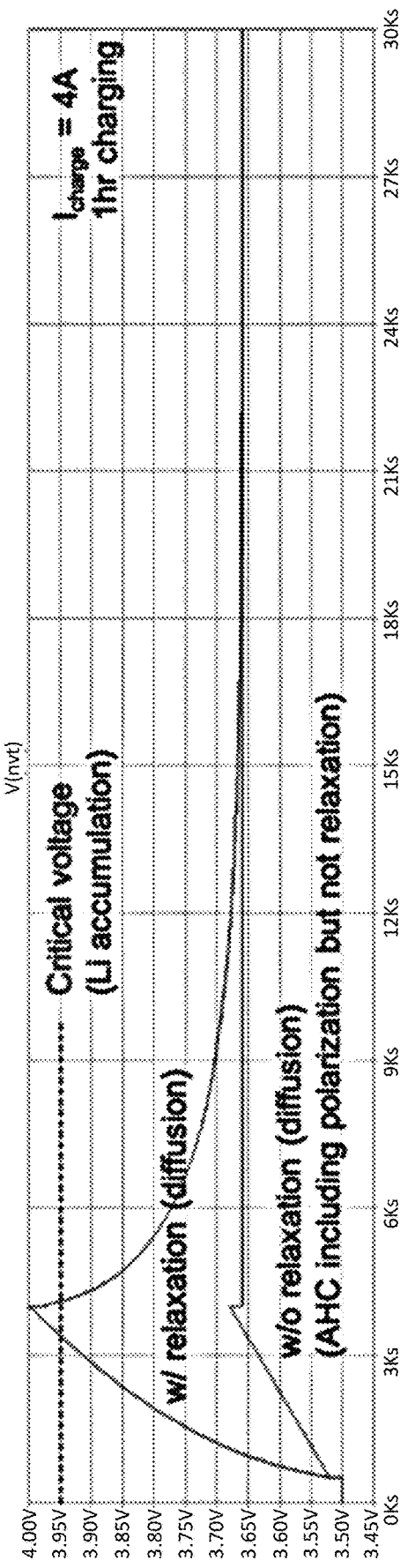
Figure 9C:
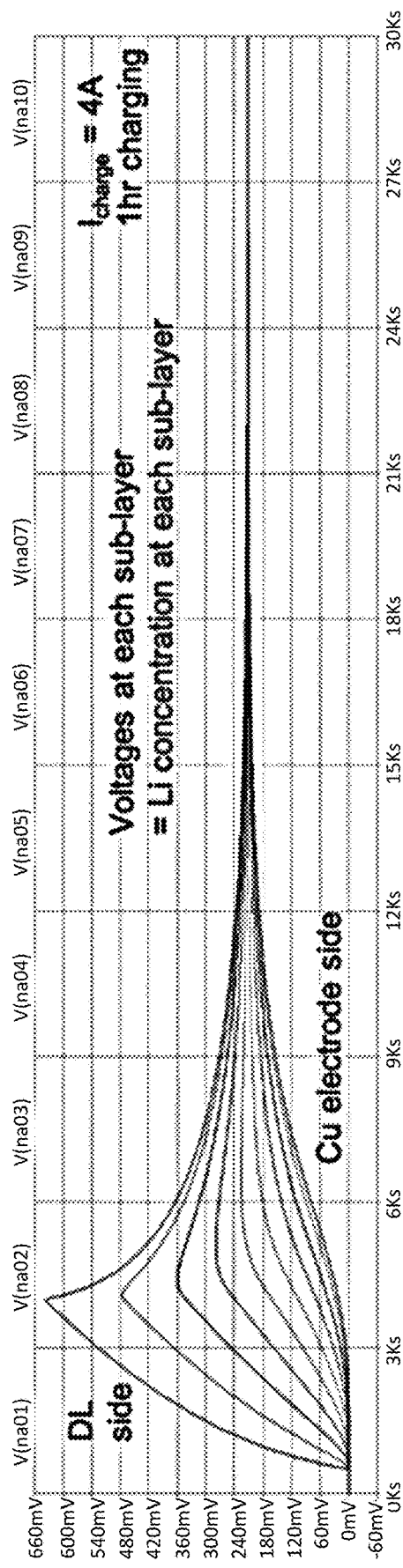
FIG. 9c: Li concentration simulation results at different parts of the anode.
Figure 10:
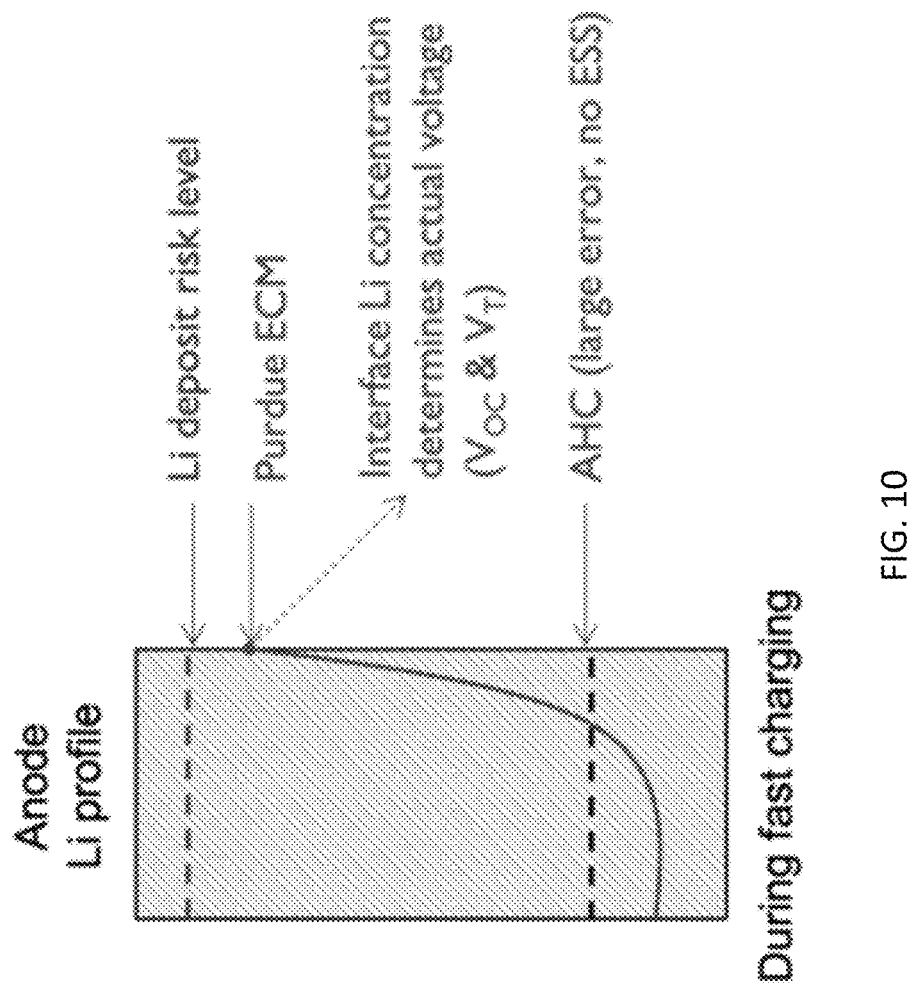
FIG. 10 is a schematic which illustrates an anode Li concentration profile during fast charging.

Referring to FIGS. 9a, 9b, and 9c, set of graphs are provided which illustrate a charging simulation utilizing the battery ECM—FIG. 9a: battery terminal voltage over time with different charging current, FIG. 9b: battery terminal voltage (4 A charging current) with and without diffusion mode, and FIG. 9c: Li concentration simulation results at different parts of the anode. These figures shows SPICE transient simulation results showing battery terminal voltage and Li concentration at different layers in electrode during battery charging with a square-wave current. These results show that when the diffusion model is not included, the predicted battery terminal voltage and interface Li concentration are quite off from experimentally expected values. Accurate interface concentration prediction is important for battery design and real-time analysis. For example, as shown in FIG. 10, during fast charging, Li concentration at the electrode interfacing electrolyte becomes much higher than the average Li concentration. Once the interface Li concentration level reaches a critical level, an irreversible Li deposition (referred to in the art as dendrites) begins that degrades battery performance. A similar issue can happen during battery discharging. For example, during discharging the Li concentration at the electrode (anode) layer interfacing electrolyte can be much lower than the average, and when it is too low an irreversible battery degradation can happen. The ECM can be used to accurately predict the interface Li concentration during charging/discharging and provide a warning before it reaches critical levels. Widely used battery modeling methods such as ampere-hour counting (AHC) can predict only the average Li concentration but not the concentration profile. Using the calculated Li concentration profile, we can calculate an average Li concentration in the electrode and use the average Li concentration to predict battery SoC.

Figure 11A:
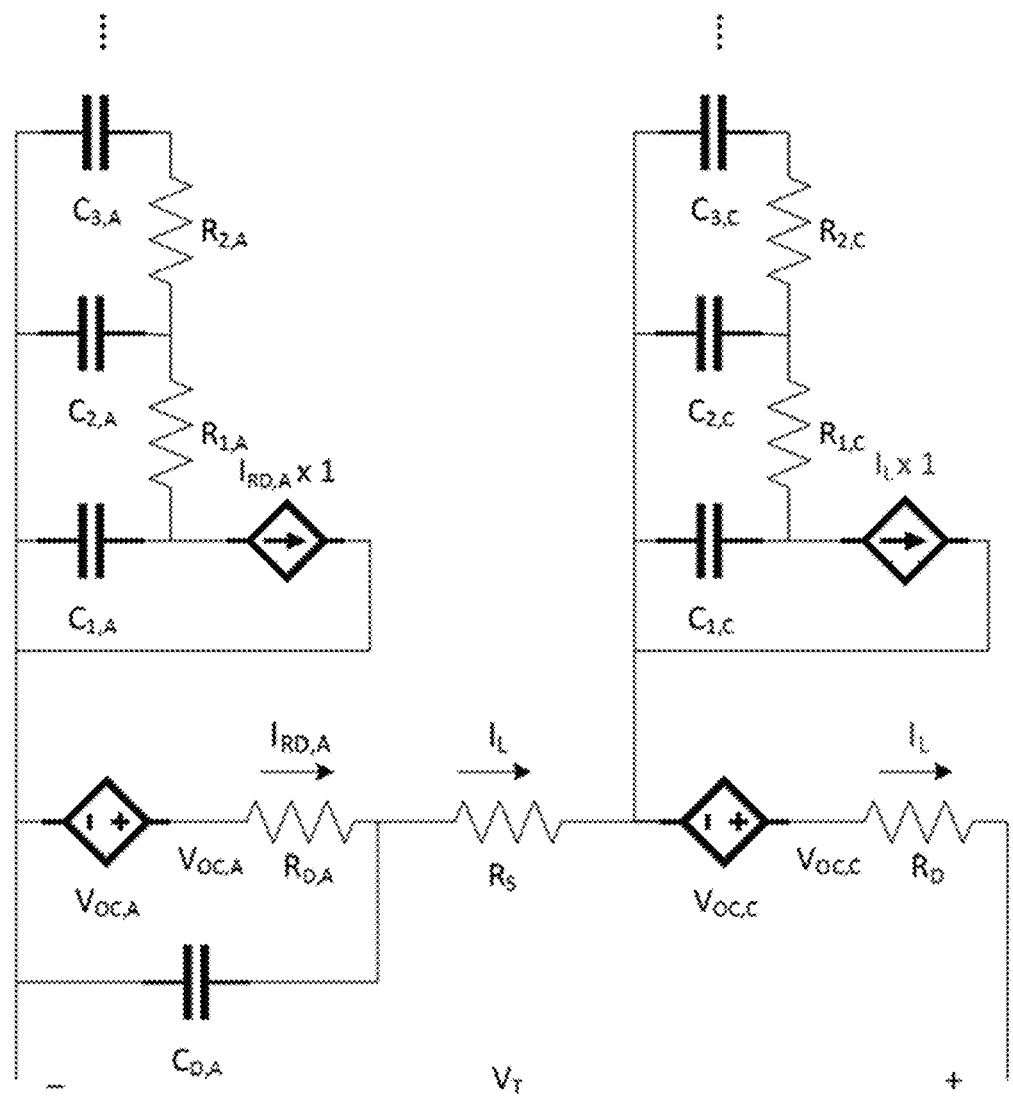
FIGS. 11a and 11b are schematics which illustrate an example of a simplified ECM, according to the present disclosure.
Figure 11B:
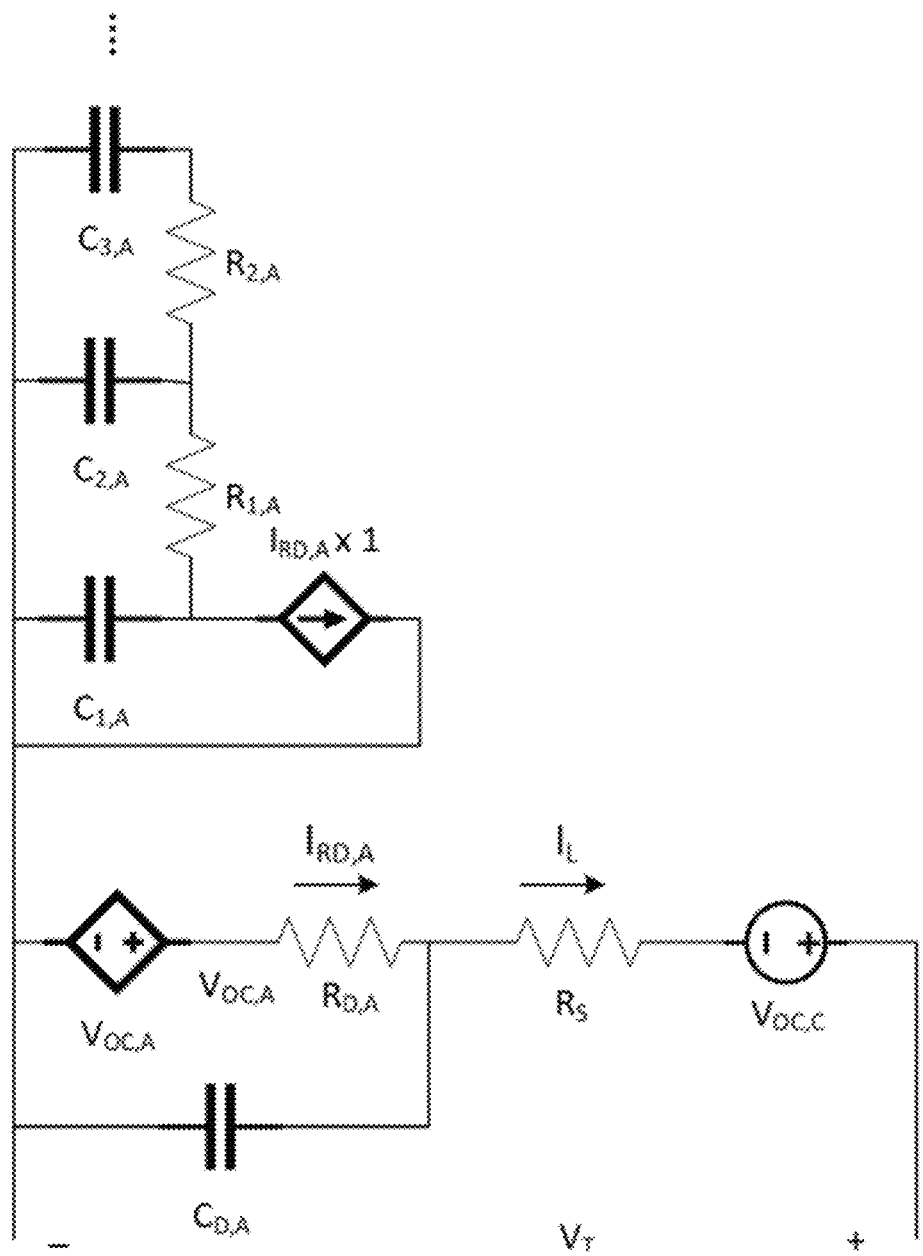

It should be noted that the ECM shown in FIG. 2c can be simplified depending on the level of required accuracy. For example, one of the double-layer capacitances (e.g., the cathode double layer capacitance) can be ignored as shown in FIG. 11a when that double-layer capacitance is much higher than the other one (i.e., the anode double layer). When Li diffusion in one electrode is much faster than the other electrode, the part associated with Li diffusion modeling can be ignored for one electrode as shown in FIG. 11b. Different levels of simplification can be made and the decision on simplification can be made based on the tradeoff between accuracy and computing load.

Other aspects of the system and methods provided herein describe utilization of the ECM and measured battery terminal voltage and current to extract the ECM parameter and use the extracted ECM parameter values to estimate battery SoC and SoH. Different types of extraction methods can be used for the ECM parameter extraction. In this exemplary implementation, a recursive least squares (RLS) method is used for parameter extraction. The ECM shown in FIG. 2c is used for this exemplary parameter extraction. Because the number of parameters to be extracted is reduced for the simplified versions shown in FIG. 11a, the extraction process will be also simplified, accordingly.

The double-layer voltages in the ECM can be described as shown below:

Continuous Time Domain $$\begin{cases} V_{D1}(t) = V_{D1}(t_0)e^{\frac{t-t_0}{\tau_1}} + \int_{t_0}^{t} e^{\frac{\tau-t_0}{\tau_1}}\left(\frac{I_L(\tau)}{C_{D1}} + \frac{V_{OC1}(\tau)}{R_{D1}C_{D1}}\right)d\tau \\ V_{D2}(t) = V_{D2}(t_0)e^{\frac{t-t_0}{\tau_2}} + \int_{t_0}^{t} e^{\frac{\tau-t_0}{\tau_2}}\left(\frac{I_L(\tau)}{C_{D2}} + \frac{V_{OC2}(\tau)}{R_{D2}C_{D2}}\right)d\tau \end{cases},$$

where $$\begin{cases} R_S = R_{anode} + R_{electrolyte} + R_{cathode} \\ R_{D1} = \text{anode double layer } R \\ C_{D1} = \text{anode double layer } C \\ R_{D2} = \text{cathode double layer } R \\ C_{D2} = \text{cathode double layer } C \end{cases}$$

$$\begin{cases} R_{A,1\ldots n} = \frac{R_{D,anode}}{n-1} \\ C_{A,1\ldots n} = \frac{C_{max}}{n} \end{cases}$$

$$\begin{cases} R_{C,2\ldots n} = \frac{R_{D,cathode}}{n-1} \\ C_{C,2\ldots n} = \frac{C_{max}}{n} \end{cases}$$

$$\begin{cases} V_{OC,A} \\ V_{OC,C} \end{cases}$$

The continuous-time domain equations can be transformed into discrete-time domain equations as shown below:

Discrete Time Domain:

$$\begin{cases} V_{D1,k} = V_{D1,k-1}e^{-\frac{\Delta t}{\tau_1}} + \frac{\Delta t}{2}\left[\frac{I_{L,k-1}}{C_{D1}} + \frac{V_{OC1,k-1}}{\tau_1} + e^{-\frac{\Delta t}{\tau_1}}\left(\frac{I_{L,k}}{C_{D1}} + \frac{V_{OC1,k}}{\tau_1}\right)\right] \\ V_{D2,k} = V_{D2,k-1}e^{-\frac{\Delta t}{\tau_2}} + \frac{\Delta t}{2}\left[\frac{I_{L,k-1}}{C_{D2}} + \frac{V_{OC2,k-1}}{\tau_2} + e^{-\frac{\Delta t}{\tau_2}}\left(\frac{I_{L,k}}{C_{D2}} + \frac{V_{OC2,k}}{\tau_2}\right)\right] \end{cases}.$$

The equation providing the relation between the double layer voltages and ECM parameters using impedance equations can also be obtained, but, in that case, a term that represents the circuit initial condition needs to be added which complicates the equations. For this reason, we use the integrodifferential equations in this exemplary implementation. Using the discrete-time domain equations, we can describe battery terminal voltage as the multiplication of data and parameter matrixes as shown below:

Data & Parameter Matrix $$\begin{cases} \Phi_k = [1 \ V_{T,k-1} \ V_{T,k-2} \ I_{L,k} \ I_{L,k-1} \ I_{L,k-2}] \\ \Theta_k = [(c_1 V_{OC1} + c_2 V_{OC2}) \ c_3 \ c_4 \ c_5 \ c_6 \ c_7]^T, \\ V_{T,k} = \Phi_k \Theta_k + e_k \end{cases}$$

where $$\begin{cases} \Theta_k[2] = c_3 = -2 + e^{-\frac{\Delta t}{R_{D1}C_{D1}}} + e^{-\frac{\Delta t}{R_{D2}C_{D2}}} \\ \Theta_k[3] = c_4 = -1 + e^{-\frac{\Delta t}{R_{D1}C_{D1}}} + e^{-\frac{\Delta t}{R_{D2}C_{D2}}} \\ \Theta_k[4] = c_5 = -R_S + \frac{\Delta t}{2C_{D1}}e^{-\frac{\Delta t}{\tau_1}} + \frac{\Delta t}{2C_{D2}}e^{-\frac{\Delta t}{\tau_2}} \\ \Theta_k[5] = c_6 = \left(-2 + e^{-\frac{\Delta t}{\tau}} + e^{-\frac{\Delta t}{\tau_2}}\right) + \frac{\Delta t}{2C_{D1}}\left(1 + e^{-\frac{\Delta t}{\tau}}\right) + \frac{\Delta t}{2C_{D2}}\left(1 + e^{-\frac{\Delta t}{\tau_2}}\right) \\ \Theta_k[6] = c_7 = \left(-1 + e^{-\frac{\Delta t}{\tau}} + e^{-\frac{\Delta t}{\tau_2}}\right)R_S + \frac{\Delta t}{2C_{D1}} + \frac{\Delta t}{2C_{D2}} \end{cases}$$

The parameters of interest include $R_{D1}$ and $C_{D1}$ resistance and capacitance for the anode's double layer; $R_{D2}$ and $C_{D2}$ resistance and capacitance for the cathode's double layer; and Rs the electrolyte resistance.

A data matrix can be defined which includes battery terminal voltage and current (parameters that can be measured), and the parameter matrix includes only the ECM parameters that need to be extracted. Because the battery terminal voltage that can be measured is described as a multiplication of data matrix that includes only measurable parameters and a parameter matrix that includes parameters to be extracted, we can extract the parameter matrix values using RLS. Although the ECM has seven parameters VOC1 (i.e., VOC at anode), VOC2 (i.e., VOC at cathode), $R_S$ (i.e., series combination of anode, cathode and electrolyte resistances), $R_{D1}$ (i.e., double layer resistance at anode), $C_{D1}$ (i.e., double layer capacitance at anode), $R_{D2}$ (i.e., double layer resistance at cathode), $C_{D2}$ (i.e., double layer capacitance at cathode)} to be extracted, the last five elements {$c_3$, $c_4$, $c_5$, $c_6$, $c_7$} are function of five ECM parameters {$R_S$, $R_{D1}$, $C_{D1}$, $R_{D2}$, $C_{D2}$}. Consequently, we can find the five ECM parameter values $\{R_S, R_{D1}, C_{D1}, R_{D2}, C_{D2}\}$ using the five extracted parameter matrix values $\{c_3, c_4, c_5, c_6, c_7\}$. Because the method treats VoC1 and VoC2, which are voltage-dependent voltage source outputs, as independent variables, the diffusion-related parameters—RC network parameters—do not affect the extraction process and can be extracted separately if required.

It should be noted that, unlike existing ECMs, the fully SPICE compatible model can accurately predict battery electrical characteristics including impedance over a wide frequency range, relaxation, polarization, and Li concentration profile, and yet supports parameter extraction utilizing compact algorithms that can be easily implemented using low-cost computing devices with limited computing power (ex: micro-controller). The compatibility with a low-cost computing device is important for real-time online applications.

Figure 12:
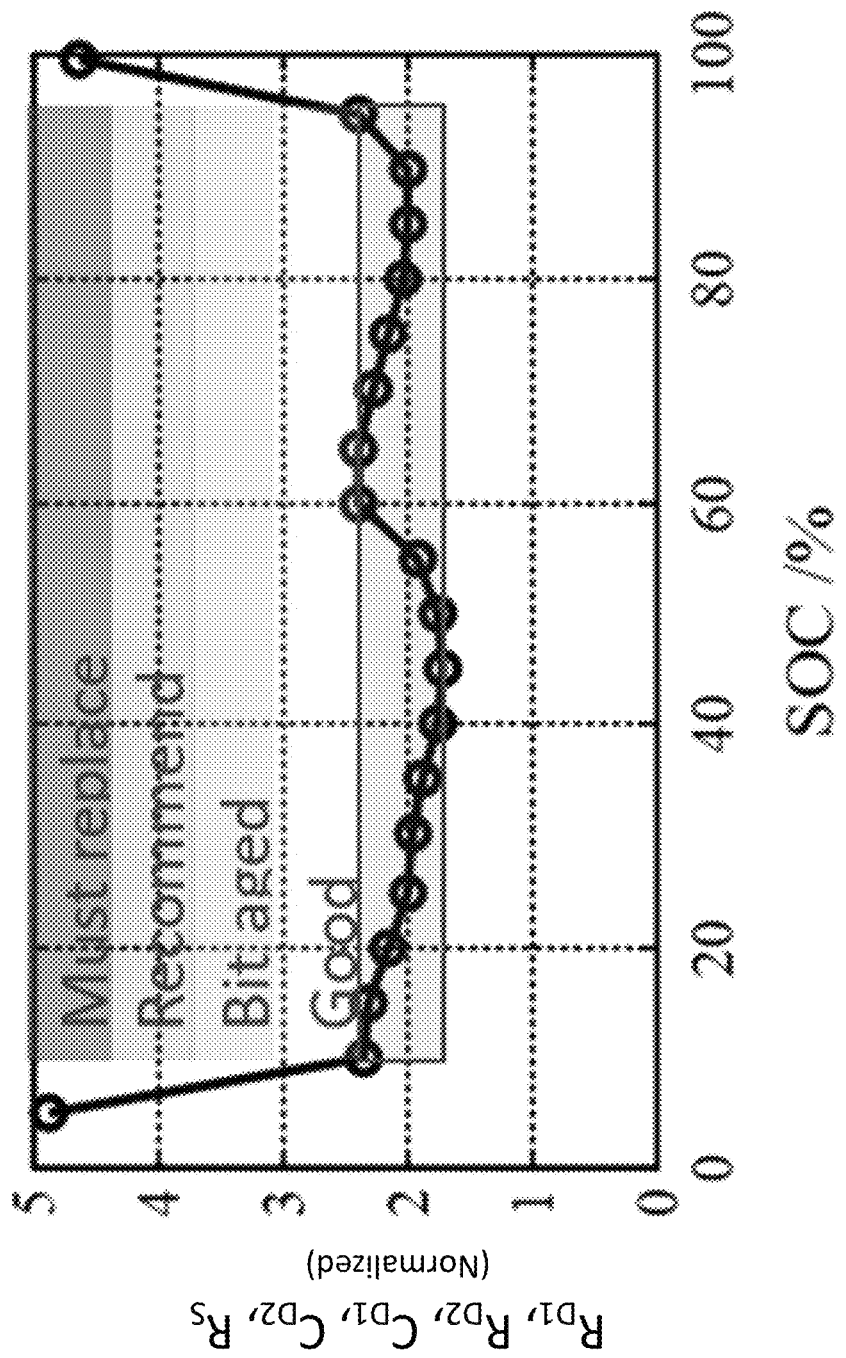
FIG. 12 is a graph of $R_D$ in mΩ vs. SoC % which illustrates an example of state of health (SoH) estimation utilizing extracted ECM parameter values.

Once the above-mentioned parameters have been extracted, one aspect of the system and methods described herein is using the extracted ECM parameters $\{R_S, R_{D1}, C_{D1}, R_{D2}, C_{D2}\}$ for SoH estimation. It is well known that battery ECM parameter values change over aging. Battery electrode-electrolyte interface double-layer capacitance and resistance particularly show a strong correlation with battery aging. As shown in FIG. 12, we can define battery aging status bins utilizing the ECM parameter values and estimate battery SoH by checking the extracted ECM parameter values as a function of SoC over a period of time and the status bin to which it thus belongs.

Figure 13:
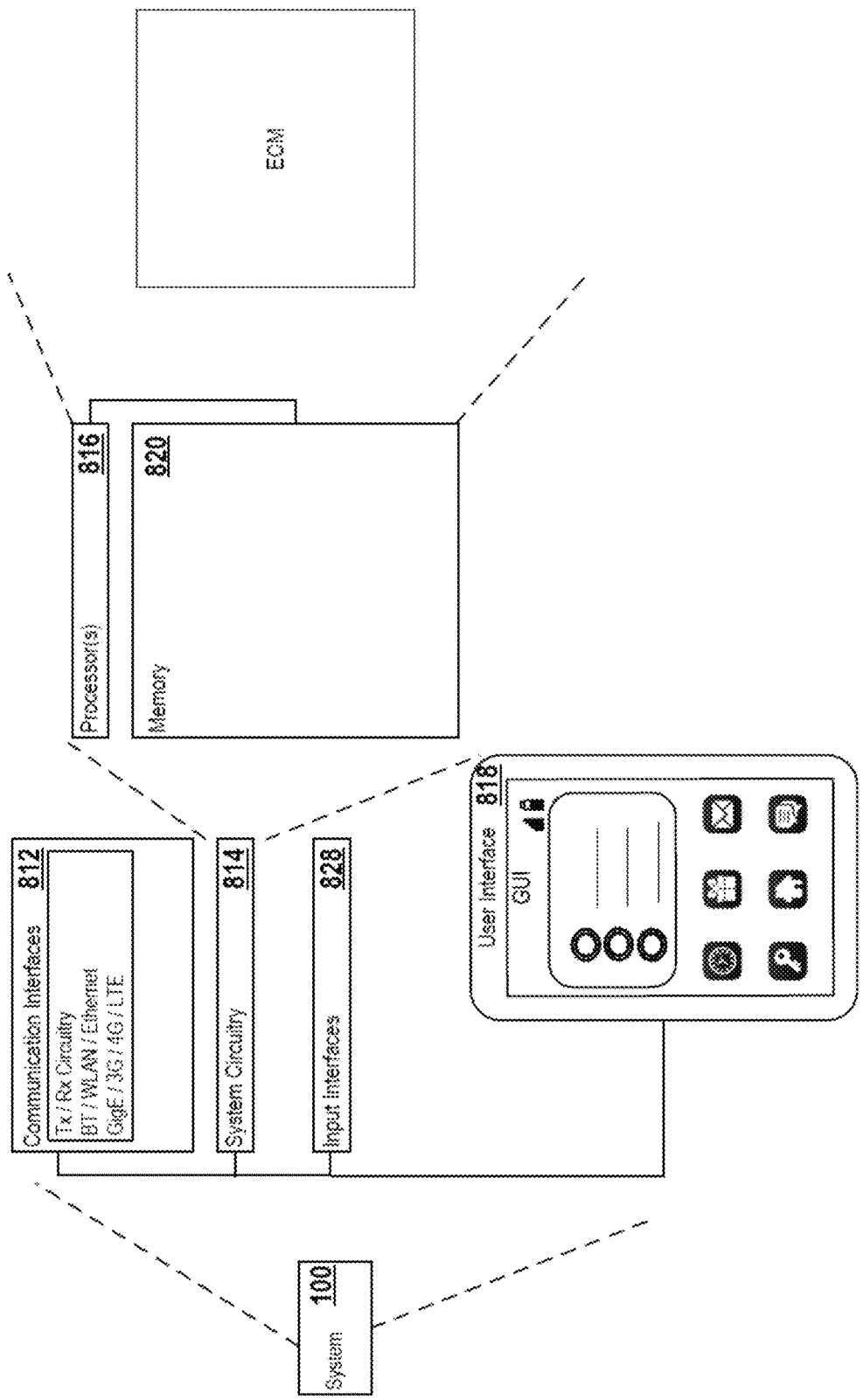
FIG. 13 is a schematic of a computer system associated with modeling and operation of the system according to the present disclosure.

FIG. 13 illustrates an example of a computing system 100. The system 100 may include communication interfaces 812, input interfaces 828 and/or system circuitry 814. The system circuitry 814 may include a processor 816 or multiple processors. Alternatively or in addition, the system circuitry 814 may include memory 820.

The processor 816 may be in communication with the memory 820. In some examples, the processor 816 may also be in communication with additional elements, such as the communication interfaces 812, the input interfaces 828, and/or the user interface 818. Examples of the processor 816 may include a general processor, a central processing unit, logical CPUs/arrays, a microcontroller, a server, an application specific integrated circuit (ASIC), a digital signal processor, a field programmable gate array (FPGA), and/or a digital circuit, analog circuit, or some combination thereof.

The processor 816 may be one or more devices operable to execute logic. The logic may include computer executable instructions or computer code stored in the memory 820 or in other memory that when executed by the processor 816, cause the processor 816 to perform the operations the ECM and/or the system 100. The computer code may include instructions executable with the processor 816.

The memory 820 may be any device for storing and retrieving data or any combination thereof. The memory 820 may include non-volatile and/or volatile memory, such as a random access memory (RAM), a read-only memory (ROM), an erasable programmable read-only memory (EPROM), or flash memory. Alternatively or in addition, the memory 820 may include an optical, magnetic (hard-drive), solid-state drive or any other form of data storage device. The memory 820 may include at least one of the ECM, and/or the system 100. Alternatively or in addition, the memory may include any other component or sub-component of the system 100 described herein.

The user interface 818 may include any interface for displaying graphical information. The system circuitry 814 and/or the communications interface(s) 812 may communicate signals or commands to the user interface 818 that cause the user interface to display graphical information. Alternatively or in addition, the user interface 818 may be remote to the system 100 and the system circuitry 814 and/or communication interface(s) may communicate instructions, such as HTML, to the user interface to cause the user interface to display, compile, and/or render information content. In some examples, the content displayed by the user interface 818 may be interactive or responsive to user input. For example, the user interface 818 may communicate signals, messages, and/or information back to the communications interface 812 or system circuitry 814.

The system 100 may be implemented in many different ways. In some examples, the system 100 may be implemented with one or more logical components. For example, the logical components of the system 100 may be hardware or a combination of hardware and software. The logical components may include the ECM or any component or subcomponent of the system 100. In some examples, each logic component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each component may include memory hardware, such as a portion of the memory 820, for example, that comprises instructions executable with the processor 816 or other processor to implement one or more of the features of the logical components. When any one of the logical components includes the portion of the memory that comprises instructions executable with the processor 816, the component may or may not include the processor 816. In some examples, each logical component may just be the portion of the memory 820 or other physical memory that comprises instructions executable with the processor 816, or other processor(s), to implement the features of the corresponding component without the component including any other hardware. Because each component includes at least some hardware even when the included hardware comprises software, each component may be interchangeably referred to as a hardware component.

Some features are shown stored in a computer readable storage medium (for example, as logic implemented as computer executable instructions or as data structures in memory). All or part of the system and its logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL)).

All of the discussion, regardless of the particular implementation described, is illustrative in nature, rather than limiting. For example, although selected aspects, features, or components of the implementations are depicted as being stored in memory(s), all or part of the system or systems may be stored on, distributed across, or read from other computer readable storage media, for example, secondary storage devices such as hard disks, flash memory drives, floppy disks, and CD-ROMs. Moreover, the various logical units, circuitry and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one example, the instructions are stored on a removable media device for reading by local or remote systems. In other examples, the logic or instructions are stored in a remote location for transfer through a computer network or over telephone lines. In yet other examples, the logic or instructions are stored within a given computer and/or central processing unit ("CPU").

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same apparatus executing a same program or different programs. The components may be resident on separate hardware, such as separate removable circuit boards, or share common hardware, such as a same memory and processor for implementing instructions from the memory. Programs may be parts of a single program, separate programs, or distributed across several memories and processors.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

Those having ordinary skill in the art will recognize that numerous modifications can be made to the specific implementations described above. The implementations should not be limited to the particular limitations described. Other implementations may be possible.

The invention claimed is:

1. A method of determining state of health (SoH) of a battery, comprising:
receiving a predetermined open circuit voltage (Voc) vs. a state of charge (SoC) characteristics for a pristine battery, the battery comprising:
an anode electrode assembly, including:
an anode collector;
an anode electrode constituting a plurality of anode electrode slices;
an anode double-layer;
an electrolyte; and
a cathode electrode assembly, including:
a cathode collector;
a cathode constituting a plurality of cathode electrode slices;
a cathode double-layer,
wherein during a charging cycle ionic electrolytic particles within the electrolyte migrate from the cathode assembly to the anode double-layer and via a diffusion process diffuse into the plurality of anode slices, and wherein during a discharge cycle the ionic electrolytic particles within the electrolyte migrate from the anode assembly to the cathode double-layer and via a diffusion process diffuse into the plurality of cathode slices;
establishing a single battery model including physical diffusion characteristics and electrical characteristics based on lumped parameters thereby modeling diffusion resistance and capacitance from associated double-layers to associated slices as well as electrical characteristics based on electrical resistance and capacitance from the anode collector to the cathode collector, thereby generating equations describing voltage at the anode and cathode double-layers;
solving the double-layer equations, thereby generating solutions for anode and cathode double-layer electrical characteristics; and
establishing a relationship between the solved double-layer characteristics and the SoC, thereby determining a SoH of the battery based on said relationship.

2. The method of claim 1, wherein the step of solving the double-layer equations includes a numerical error minimization process.

3. The method of claim 2, wherein the error minimization process is based on a recursive least squares regression method.

4. The method of claim 1, wherein the lumped parameters of the physical diffusion characteristics part of the battery model include diffusion resistance and capacitance associated with each anode slice of the plurality of anode slices and each cathode slice of the plurality of cathode slices.

5. The method of claim 4, wherein the diffusion resistance and capacitance are formed as an associated plurality of parallel coupled networks associated with the plurality of anode slices and the plurality of cathode slices, wherein the first slices of the pluralities of anode slices and cathode slice are coupled to the associated double-layer and are driven by i) a current controlled current source controlled based on current passing through a resistance of the double-layer, and ii) a voltage controlled voltage source controlled based on a non-linear relationship between a voltage at the first slice.

6. The method of claim 5, wherein the non-linear relationship is based on the predetermined $V_{OC}$ vs. SOC characteristics for the pristine battery.

7. The method of claim 1, wherein the solved double-layer characteristics vs. the SoC is the resistance of the associated double-layer.

8. The method of claim 7, wherein the level of the anode or cathode double-layer resistance determines the SoH of the battery between a first SoC level and a second SoC level.

9. The method of claim 8, wherein the first level is about 15% of the SoC and the second level is about 85% of the SoC.

10. The method of claim 9, wherein if the either of the anode or cathode double-layer resistance is i) within a first set of predetermined thresholds, the SoH is considered as good, ii) outside of the first set of predetermined thresholds, but within a second set of thresholds, the SoH is considered as aged, iii) outside of the second set of predetermined thresholds, but within a third set of thresholds, the SoH is considered as recommend replacement of the battery, and iv) outside of the third set of predetermined thresholds, but within a fourth set of thresholds, the SoH is considered as mandatory replacement of the battery.

11. A system for determining state of health (SoH) of a battery, comprising:
  a battery comprising:
    an anode electrode assembly, including:
      an anode collector;
      an anode electrode constituting a plurality of anode electrode slices;
      an anode double-layer;
    an electrolyte; and
    a cathode electrode assembly, including:
      a cathode collector;
      a cathode electrode constituting a plurality of cathode electrode slices;
      a cathode double-layer,
    wherein during a charging cycle ionic electrolytic particles within the electrolyte migrate from the cathode assembly to the anode double-layer and via a diffusion process diffuse into the plurality of anode slices, and wherein during a discharge cycle the ionic electrolytic particles within the electrolyte migrate from the anode assembly to the cathode double-layer and via a diffusion process diffuse into the plurality of cathode slices; and2
  a processor communicating with a non-transient memory, configured to:
    receive a predetermined open circuit voltage (Voc) vs. a state of charge (SoC) characteristics for a pristine battery;
    utilize a single battery model including physical diffusion characteristics and electrical characteristics based on lumped parameters thereby modeling diffusion resistance and capacitance from associated double-layers to associated slices as well as electrical characteristics based on electrical resistance and capacitance from the anode collector to the cathode collector;
    generate equations describing voltage at the anode and cathode double-layers;
    solve the double-layer equations, thereby generating solutions for anode and cathode double-layer electrical characteristics; and
    establish a relationship between the solved double-layer characteristics and the SoC, thereby determining a SoH of the battery based on said relationship.

12. The system of claim 11, wherein the step of solving the double-layer equations includes a numerical error minimization process.

13. The system of claim 12, wherein the error minimization process is based on a recursive least squares regression method.

14. The system of claim 11, wherein the lumped parameters of the physical diffusion characteristics part of the battery model include diffusion resistance and capacitance associated with each anode slice of the plurality of anode slices and each cathode slice of the plurality of cathode slices.

15. The system of claim 14, wherein the diffusion resistance and capacitance are formed as an associated plurality of parallel coupled networks associated with the plurality of anode slices and the plurality of cathode slices , wherein the first slices of the pluralities of anode slices and cathode slice are coupled to the associated double-layer and are driven by i) a current controlled current source controlled based on current passing through a resistance of the double-layer, and ii) a voltage controlled voltage source controlled based on a non-linear relationship between a voltage at the first slice.

16. The system of claim 15, wherein the non-linear relationship is based on the predetermined $V_{OC}$ vs. SoC characteristics for the pristine battery.

17. The system of claim 11, wherein the solved double-layer characteristics vs. the SoC is the resistance of the associated double-layer.

18. The system of claim 17, wherein the level of the anode or cathode double-layer resistance determines the SoH of the battery between a first SoC level and a second SoC level.

19. The system of claim 18, wherein the first level is about 15% of the SoC and the second level is about 85% of the SoC.

20. The system of claim 19, wherein if the either of the anode or cathode double-layer resistance is i) within a first set of predetermined thresholds, the SoH is considered as good, ii) outside of the first set of predetermined thresholds, but within a second set of thresholds, the SoH is considered as aged, iii) outside of the second set of predetermined thresholds, but within a third set of thresholds, the SoH is considered as recommend replacement of the battery, and iv) outside of the third set of predetermined thresholds, but within a fourth set of thresholds, the SoH is considered as mandatory replacement of the battery.

* * * * *